United States Patent
Yu et al.

(10) Patent No.: US 11,635,555 B2
(45) Date of Patent: Apr. 25, 2023

(54) COLOUR FILM SHEET AND FABRICATING METHOD THEREFOR, COLOUR FILM SUBSTRATE, AND DISPLAY APPARATUS

(71) Applicant: BOE TECHNOLOGY GROUP CO., LTD., Beijing (CN)

(72) Inventors: Jing Yu, Beijing (CN); Gang Yu, Beijing (CN); Yu Ju Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 405 days.

(21) Appl. No.: 16/641,757

(22) PCT Filed: Aug. 17, 2018

(86) PCT No.: PCT/CN2018/100941
§ 371 (c)(1),
(2) Date: Feb. 25, 2020

(87) PCT Pub. No.: WO2019/042151
PCT Pub. Date: Mar. 7, 2019

(65) Prior Publication Data
US 2020/0393600 A1   Dec. 17, 2020

(30) Foreign Application Priority Data
Aug. 30, 2017   (CN) .......................... 201710764894.5

(51) Int. Cl.
*G02B 5/20* (2006.01)
*G02B 5/28* (2006.01)
(Continued)

(52) U.S. Cl.
CPC .............. *G02B 5/206* (2013.01); *B82Y 20/00* (2013.01); *G02B 5/28* (2013.01); *G02F 1/01791* (2021.01);
(Continued)

(58) Field of Classification Search
CPC . G02F 2/02; G02F 2001/01791; H01L 33/50; H01L 33/507; H05B 33/145; B82Y 30/00; C01P 2004/64
See application file for complete search history.

(56) References Cited

U.S. PATENT DOCUMENTS 9,690,135 B2   6/2017   Guo et al.
9,778,509 B2   10/2017  Ishikawa
(Continued)

FOREIGN PATENT DOCUMENTS

CN   103226260 A   7/2013
CN   103278876 A   9/2013
(Continued)

OTHER PUBLICATIONS

English translation for JP-2016065178-A, Kamii (Year: 2016).*
(Continued)

*Primary Examiner* — Jonathan Y Jung
(74) *Attorney, Agent, or Firm* — Collard & Roe, P.C.

(57) ABSTRACT

A color filter, a method for manufacturing a color filter, a color filter substrate, and a display device are disclosed. The color filter includes a first quantum dot light emitting layer and a first reflective layer. The first quantum dot light emitting layer has a light incident surface; and the first reflective layer is on a side of the first quantum dot light emitting layer away from the light incident surface, the first quantum dot light emitting layer includes a plurality of first quantum dots, the first quantum dots are configured to be stimulated by light of a first wavelength from the light incident surface to emit light of a second wavelength, and the first reflective layer is configured to transmit the light of the second wavelength and reflect the light of the first wavelength.

17 Claims, 3 Drawing Sheets

(51) Int. Cl.
  *G02F 1/1335* (2006.01)
  *G02F 1/13357* (2006.01)
  *B82Y 20/00* (2011.01)
  *G02F 2/02* (2006.01)
  *G02F 1/017* (2006.01)
  *H01L 33/50* (2010.01)

(52) U.S. Cl.
  CPC .. *G02F 1/133516* (2013.01); *G02F 1/133617* (2013.01); *G02F 2/02* (2013.01); *H01L 33/50* (2013.01); *G02F 2202/36* (2013.01); *H01L 33/507* (2013.01)

(56) References Cited

U.S. PATENT DOCUMENTS

| | | | |
|---|---|---|---|
| 9,851,601 | B2 | 12/2017 | Guo et al. |
| 10,203,547 | B2 | 2/2019 | Li |
| 10,520,765 | B2 | 12/2019 | Chung |
| 2014/0340865 | A1 | 11/2014 | Hikmet et al. |
| 2015/0301408 | A1 | 10/2015 | Li |
| 2017/0082892 | A1* | 3/2017 | Chung ............ G02F 2/02 |
| 2017/0242292 | A1* | 8/2017 | Jeon ............ G02F 1/133617 |
| 2018/0006093 | A1* | 1/2018 | Kim ............ H01L 33/06 |
| 2020/0407627 | A1* | 12/2020 | Zhou ............ C09K 11/883 |

FOREIGN PATENT DOCUMENTS

| | | | |
|---|---|---|---|
| CN | 203241664 U | 10/2013 | |
| CN | 103412436 A | 11/2013 | |
| CN | 103605234 A | 2/2014 | |
| CN | 104011585 A | 8/2014 | |
| CN | 105911766 A | 8/2016 | |
| CN | 106547136 A | 3/2017 | |
| CN | 107357080 A | 11/2017 | |
| JP | 2015-102857 A | 6/2015 | |
| JP | 2016065178 A * | 4/2016 | ............ C08J 5/18 |
| JP | 2016-161833 A | 9/2016 | |
| WO | 2012/087269 A1 | 6/2012 | |

OTHER PUBLICATIONS

International Search Report of PCT/CN2018/100941 in Chinese, dated Nov. 7, 2018, with English translation.
Notice of Transmittal of the International Search Report of PCT/CN2018/100941 in Chinese, dated Nov. 7, 2018.
Written Opinion of the International Searching Authority of PCT/CN2018/100941 in Chinese, dated Nov. 7, 2018 with English translation.
Chinese Office Action in Chinese Application No. 201710764894.5, dated Apr. 2, 2020 with English translation.

* cited by examiner

COLOUR FILM SHEET AND FABRICATING METHOD THEREFOR, COLOUR FILM SUBSTRATE, AND DISPLAY APPARATUS

CROSS REFERENCE TO RELATED APPLICATIONS

This application is the National Stage of PCT/CN2018/100941 filed on Aug. 17, 2018, which claims priority under 35 U.S.C. § 119 of Chinese Application No. 201710764894.5 filed on Aug. 30, 2017, the disclosure of which is incorporated by reference.

TECHNICAL FIELD

Embodiments of the present disclosure relate to a color filter, a method for manufacturing a color filter, a color filter substrate, and a display device.

BACKGROUND

With continuous development of display technology, people have higher and higher requirements for the image quality (such as color gamut) of display devices. Common display devices implement full color display through the color filter. For example, a liquid crystal display device may include a backlight module, an array substrate, a color filter substrate, and a liquid crystal layer located between the array substrate and the color filter substrate. The white light emitted by the backlight module passes through the color filter on the color filter substrate to display various colors.

The common color filter is to disperse the dye into the negative photoresist and absorb light of other wave bands to display pure color light (e.g., red light, green light, or blue light). However, the color filter that implements displaying the pure color light by absorbing the light of other wave bands greatly reduces the utilization of the backlight. Quantum dots (QDs) are a type of nanoparticles composed of elements of group II-VI or group III-V. The particle size of the quantum dot is generally between 1 nm to 20 nm. Because domains of electrons and holes are limited by quanta, the continuous energy band structure becomes a discrete energy level structure with molecular characteristics, and can emit fluorescence when stimulated. The emission spectrum of the quantum dot can be controlled by changing the size of the quantum dot. By changing the size and the chemical composition of the quantum dot, the emission spectrum of the quantum dot can cover the entire visible light region. Therefore, the quantum dot color filter can be manufactured by utilizing the light emitting characteristics of the quantum dot.

SUMMARY

At least an embodiment of the present disclosure provides a color filter, and the color filter includes a first quantum dot light emitting layer, having a light incident surface, and a first reflective layer, on a side of the first quantum dot light emitting layer away from the light incident surface. The first quantum dot light emitting layer includes a plurality of first quantum dots, the first quantum dots are configured to be stimulated by light of a first wavelength from the light incident surface to emit light of a second wavelength, and the first reflective layer is configured to transmit the light of the second wavelength and reflect the light of the first wavelength.

For example, the color filter provided by an embodiment of the present disclosure further includes: a second quantum dot light emitting layer between the first quantum dot light emitting layer and the first reflective layer. The second quantum dot light emitting layer includes a plurality of second quantum dots and a plurality of light absorbing materials, the second quantum dots are configured to be stimulated by light of the first wavelength from the light incident surface to emit light of the second wavelength, and the light absorbing materials are configured to absorb the light of the first wavelength.

For example, the color filter provided by an embodiment of the present disclosure further includes: a second reflective layer on a side, where the light incident surface is, of the first quantum dot light emitting layer, and the second reflective layer is configured to transmit the light of the first wavelength and reflect the light of the second wavelength.

For example, in the color filter provided by an embodiment of the present disclosure, the light of the first wavelength is blue light, and the light of the second wavelength is red light or green light.

For example, in the color filter provided by an embodiment of the present disclosure, the first reflective layer includes a plurality of first sub-reflective layers in a sequential arrangement, each of the first sub-reflective layers includes a first refractive index layer and a second refractive index layer which are sequentially arranged in a direction from the light incident surface to the first reflective layer, and a refractive index of the first refractive index layer is greater than a refractive index of the second refractive index layer.

For example, in the color filter provided by an embodiment of the present disclosure, the first quantum dot light emitting layer is in contact with the second quantum dot light emitting layer.

For example, in the color filter provided by an embodiment of the present disclosure, the second reflective layer includes a plurality of second sub-reflective layers in a sequential arrangement, each of the second sub-reflective layers includes a third refractive index layer and a fourth refractive index layer which are sequentially arranged in a direction from the light incident surface to the first reflective layer, and a refractive index of the third refractive index layer is less than a refractive index of the fourth refractive index layer.

For example, in the color filter provided by an embodiment of the present disclosure, a thickness of the first reflective layer is in a range of 400 nm to 600 nm.

For example, in the color filter provided by an embodiment of the present disclosure, a particle size of each of the first quantum dots is in a range of 7 nm to 10 nm.

At least an embodiment of the present disclosure further provides a color filter substrate, including the color filter provided by any one of the embodiments of the present disclosure.

For example, the color filter substrate provided by an embodiment of the present disclosure further includes: a blue filter region, and the blue filter region is configured to transmit blue light.

At least an embodiment of the present disclosure further provides a display device, including the color filter provided by any one of the embodiments of the present disclosure.

At least an embodiment of the present disclosure further provides a method for manufacturing a color filter, and the method includes: mixing a plurality of first quantum dots into a first organic solvent to form a first light emitting layer material; using the first light emitting layer material to form a first quantum dot light emitting layer, where the first quantum dot light emitting layer has a light incident surface, and the first quantum dots are configured to be stimulated by light of a first wavelength to emit light of a second wavelength; and forming a first reflective layer on a side of the first quantum dot light emitting layer away from the light incident surface, where the first reflective layer is configured to transmit the light of the second wavelength and reflect the light of the first wavelength.

For example, the method for manufacturing the color filter provided by an embodiment of the present disclosure further includes: mixing a plurality of second quantum dots and a plurality of light absorbing materials into a second organic solvent to form a second light emitting layer material, where the second quantum dots are configured to be stimulated by light of the first wavelength to emit light of the second wavelength, and the light absorbing materials are configured to absorb the light of the first wavelength; and using the second light emitting layer material to form a second quantum dot light emitting layer between the first quantum dot light emitting layer and the first reflective layer.

For example, in the method for manufacturing the color filter provided by an embodiment of the present disclosure, a ratio of a mass percentage of the second quantum dots to a mass percentage of the light absorbing materials in the second light emitting layer material is in a range of 1 to 2.

For example, the method for manufacturing the color filter provided by an embodiment of the present disclosure further includes: forming a second reflective layer on a side, where the light incident surface is, of the first quantum dot light emitting layer, and the second reflective layer is configured to transmit the light of the first wavelength and reflect the light of the second wavelength.

For example, in the method for manufacturing the color filter provided by an embodiment of the present disclosure, the first light emitting layer material further includes a resin, a photoinitiator, and an additive, and a total mass percentage of the first quantum dots, the resin, the photoinitiator, and the additive in the first light emitting layer material is in a range of 15% to 30%.

For example, in the method for manufacturing the color filter provided by an embodiment of the present disclosure, a mass percentage of the first quantum dots in the first light emitting layer material is in a range of 5% to 10%, and a mass percentage of the resin in the first light emitting layer material is in a range of 5% to 25%.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly.

In a quantum dot color filter, quantum dots can be added to photoresist instead of dyes because of characteristics such as photoluminescence and narrow half-peak width. The solvent system of photoresist is generally propylene glycol monomethyl ether acetate (PGMEA). The PGMEA is an organic solvent with a strong polarity, and the ligands of general quantum dot materials are mostly non-polar ligands such as oleic acid. Therefore, in that kind of quantum dot photoresist, the ligand of the quantum dot needs to be replaced by a polar ligand. However, the chain length of the general polar ligand is relatively short, and there may be problems such as quantum dot aggregation and low quantum dot doping concentration. In addition, the quantum dots may further react with the photoinitiator or other additives in the photoresist, and it is easy to cause the aggregation and quenching of the quantum dots where the quantum dot concentration is high. Therefore, the quantum dot concentration in the photoresist cannot be too high. However, it is easy to cause a small leakage of excitation light where the quantum dot concentration is low, thereby affecting the color purity.

Figure 1:
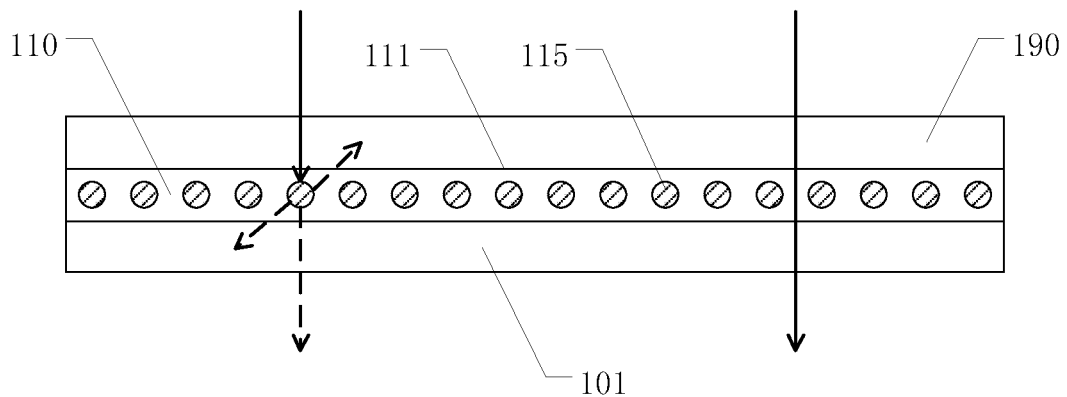
FIG. 1 is a schematic structural diagram of a color filter.

FIG. 1 is a schematic structural diagram of a color filter. As illustrated in FIG. 1, the color filter includes a base substrate 101, a quantum dot light emitting layer 110 on the base substrate 101, and a cover layer 190 on a side, away from the base substrate 101, of the quantum dot light emitting layer 110. The quantum dot light emitting layer 110 has a light incident surface 111 on a side close to the cover layer 190. The quantum dot light emitting layer 110 includes a plurality of quantum dots 115. The quantum dots 115 can be stimulated by blue light emitted from the light incident surface 111 and emit red light or green light. However, the quantum dot concentration in the quantum dot light emitting layer 110 cannot be too high, and the blue light cannot be completely converted into the red light or green light, so that part of the blue light leaks, and the color purity of the color filter is affected.

The embodiments of the present disclosure provide a color filter, a method for manufacturing a color filter, a color filter substrate, and a display device. The color filter includes a first quantum dot light emitting layer and a first reflective layer. The first quantum dot light emitting layer has a light incident surface, and the first reflective layer is located on a side of the first quantum dot light emitting layer away from the light incident surface. The first quantum dot light emitting layer includes a plurality of first quantum dots, the first quantum dots are configured to be stimulated by light of a first wavelength from the light incident surface to emit light of a second wavelength, and the first reflective layer is configured to transmit the light of the second wavelength and reflect the light of the first wavelength. Therefore, the light of the first wavelength emitted from the light incident surface can stimulate the first quantum dots in the first quantum dot light emitting layer to emit the light of the second wavelength, the light of the second wavelength is emitted through the first reflective layer, and the light of the first wavelength which is not converted by the first quantum dots in the first quantum dot light emitting layer is reflected by the first reflective layer and cannot be emitted through the first reflective layer, so that the color purity of the light emitted by the color filter is high.

Hereinafter, the color filter, the method for manufacturing the color filter, the color filter substrate, and the display device provided by the embodiments of the present disclosure will be described in detail with reference to the accompanying drawings.

Figure 2:
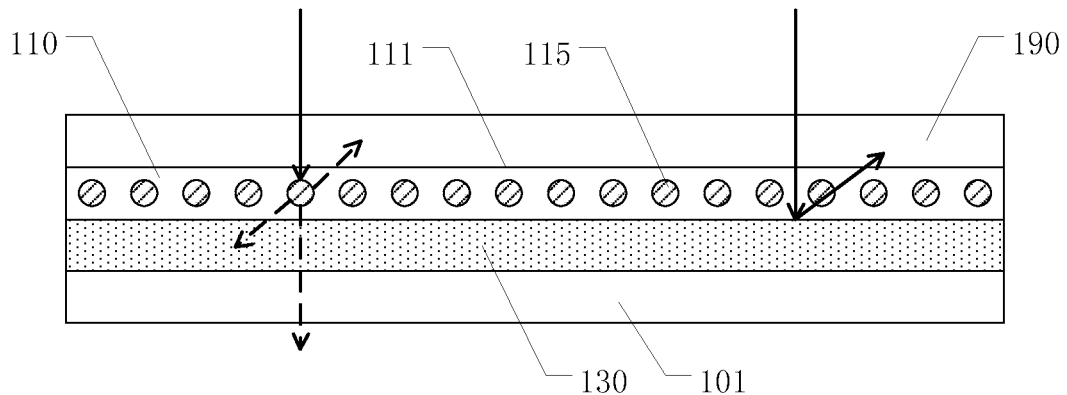
FIG. 2 is a schematic structural diagram of a color filter provided by an embodiment of the present disclosure.

An embodiment of the present disclosure provides a color filter. FIG. 2 is a schematic structural diagram of a color filter according to the embodiment. As illustrated in FIG. 2, the color filter 100 includes a first quantum dot light emitting layer 110 and a first reflective layer 130. The first quantum dot light emitting layer 110 has a light incident surface 111. The first quantum dot light emitting layer 110 includes a plurality of first quantum dots 115, and the first quantum dots 115 can be stimulated by light (as indicated by the solid line in FIG. 2) of a first wavelength from the light incident surface 111 to emit light (as indicated by the dotted line in FIG. 2) of a second wavelength, thereby allowing the color filter to emit the light of the second wavelength. The first reflective layer 130 is located on a side of the first quantum dot light emitting layer 110 away from the light incident surface 111, and can transmit the light of the second wavelength and reflect the light of the first wavelength. It should be noted that the first wavelength and second wavelength described above may not only represent a specific wavelength value, but also may represent a wavelength range. For example, the light of the first wavelength may be blue light, and the light of the second wavelength may be red light or green light. It should be noted that the light of the first wavelength includes, but is not limited to, the blue light, and the light of the second wavelength includes, and is not limited to, the red light. In addition, the light of the first wavelength can be provided by a backlight source.

In the color filter 100 provided by the embodiment, the first reflective layer 130 located on the side, away from the light incident surface 111, of the first quantum dot light emitting layer 110 can transmit the light of the second wavelength and reflect the light of the first wavelength. Therefore, the first reflective layer 130 can prevent light of the first wavelength which is not converted by the first quantum dots 115 from being emitted through the first reflective layer 130, thereby improving the color purity of the emitting light of the color filter. For example, where the light of the first wavelength is blue light and the light of the second wavelength is red light, as illustrated in FIG. 2, part of the blue light enters the first quantum dot light emitting layer 110 from the light incident surface 111 of the first quantum dot light emitting layer 110 and stimulates the first quantum dots 115 to emit red light, and part of the red light is emitted through the first reflective layer 130. Because the concentration of the first quantum dots 115 in the first quantum dot light emitting layer 110 is not too high, etc., part of the blue light is not converted by the first quantum dots 115, and the blue light that is not converted by the first quantum dots 115 is reflected by the first reflective layer 130 and cannot be emitted through the first reflective layer 130, thereby improving the color purity of red light of the color filter.

For example, the thickness of the first reflective layer is 400 nm to 600 nm. Where the thickness of the first reflective layer is in a range of 400 nm to 600 nm, the first reflective layer has both a higher reflectivity for the light of the first wavelength and a higher transmittance for the light of the second wavelength.

For example, as illustrated in FIG. 2, the color filter 100 further includes a base substrate 101 on a side, away from the light incident surface 111, of the first reflective layer 130 to support the first quantum dot light emitting layer 110 and the first reflective layer 130. The base substrate 101 may be a glass substrate.

For example, as illustrated in FIG. 2, the color filter 100 further includes a cover layer 190 on a side, where the light incident surface 111 is, of the first quantum dot light emitting layer 110 to protect the first quantum dot light emitting layer 110 described above.

For example, the material of the first quantum dots can be selected from II-VI group materials such as CdS, CdSe, CdTe, ZnO, ZnS, ZnSe, ZnTe, etc., III-V group materials such as GaAs, GaP, GaAs, GaSb, HgS, HgSe, HgTe, InAs, InP, InSb, AlAs, AlP, AlSb, etc., and other materials.

For example, in the embodiment, the light emitting wavelength or wave band of the quantum dots can be controlled by controlling the particle size of the first quantum dots. By taking ZnS quantum dots as an example, the first quantum dots can emit red light where the size of the first quantum dots is mainly 9 nm to 10 nm, and the first quantum dots can emit green light where the size of the first quantum dots is mainly 7 nm.

Figure 3:
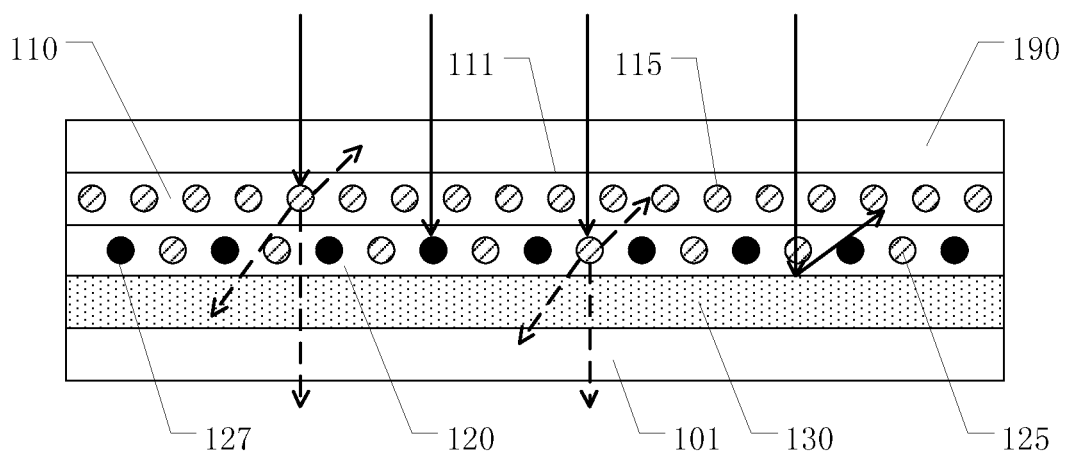
FIG. 3 is a schematic structural diagram of another color filter provided by an embodiment of the present disclosure.

FIG. 3 is a schematic structural diagram of another color filter. As illustrated in FIG. 3, the color filter further includes a second quantum dot light emitting layer 120 located between the first quantum dot light emitting layer 110 and the first reflective layer 130. The second quantum dot light emitting layer 120 includes a plurality of second quantum dots 125 and a plurality of light absorbing materials 127. The second quantum dots 125 can be stimulated by light (as indicated by the solid line in FIG. 3) of the first wavelength from the light incident surface 111 to emit light (as indicated by the dotted line in FIG. 3) of the second wavelength, and the light absorbing materials 127 can absorb the light of the first wavelength. Therefore, in one aspect, the color filter can allow light of the first wavelength, which is not converted by the first quantum dots 115 in the first quantum dot light emitting layer 110, to be converted into light of the second wavelength by the second quantum dots 125 in the second quantum dot light emitting layer 120 additionally provided, thereby further improving the utilization efficiency of the light of the first wavelength from the light incident surface 111 and reducing the light of the first wavelength through the first reflective layer 130; in another aspect, the color filter can absorb the light of the first wavelength, which is not converted by the first quantum dots 115 in the first quantum dot light emitting layer 110, through the light absorbing materials 127 in the second quantum dot light emitting layer 120 additionally provided, thereby further reducing the light of the first wavelength through the first reflective layer 130. Therefore, the color filter further improves the color purity of the emitting light, and improves the utilization efficiency of the light of the first wavelength from the light incident surface.

It should be noted that, in some examples, the size of the light absorbing materials and the size of the second quantum dots are on an order of magnitude, thereby facilitating a more even distribution of the light absorbing materials and the second quantum dots and preventing aggregation and the like.

For example, the light absorbing materials may be a dye that can absorb light of the first wavelength. Certainly, the present disclosure includes but is not limited to this.

For example, the material of the second quantum dots can be selected from II-VI group materials such as CdS, CdSe, CdTe, ZnO, ZnS, ZnSe, ZnTe, etc., III-V group materials such as GaAs, GaP, GaAs, GaSb, HgS, HgSe, HgTe, InAs, InP, InSb, AlAs, AlP, AlSb, etc., and other materials. It should be noted that the material of the second quantum dots may be the same as that of the first quantum dots.

For example, in the embodiment, the light emitting wavelength or wave band of the quantum dots can be controlled by controlling the particle size of the second quantum dots. By taking ZnS quantum dots as an example, the second quantum dots can emit red light where the size of the second quantum dots is mainly 9 nm to 10 nm, and the second quantum dots can emit green light where the size of the second quantum dots is mainly 7 nm.

Figure 4:
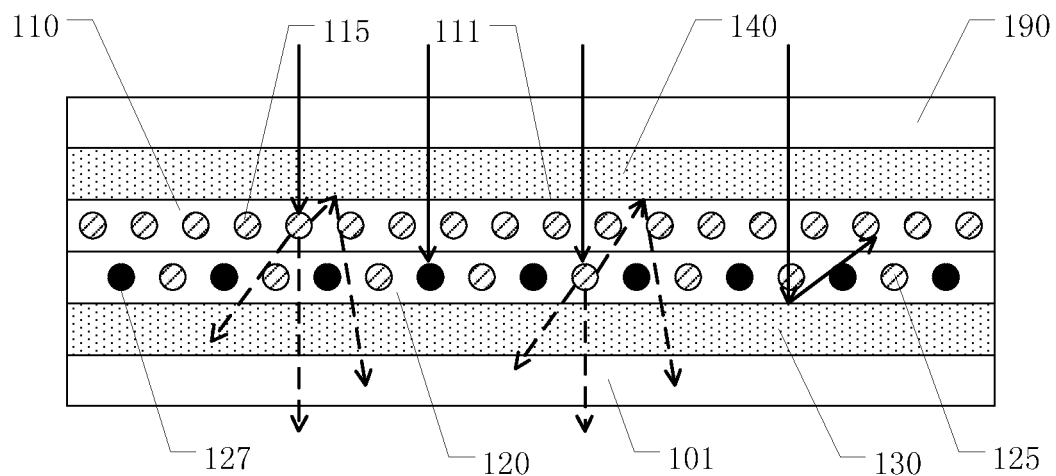
FIG. 4 is a schematic structural diagram of further still another color filter provided by an embodiment of the present disclosure.

FIG. 4 is a schematic structural diagram of further still another color filter. As illustrated in FIG. 4, the color filter further includes a second reflective layer 140 on a side, where the light incident surface 111 is, of the first quantum dot light emitting layer 110. The second reflective layer 140 can transmit light (as indicated by the solid line in FIG. 4) of the first wavelength and reflect light (as indicated by the dotted line in FIG. 4) of the second wavelength. As illustrated in FIG. 4, after the first quantum dots or the second quantum dots are stimulated by the light of the first wavelength, the first quantum dots or the second quantum dots emit the light of the second wavelength all around, and the second reflective layer 140 on the side, where the light incident surface 111 is, of the first quantum dot light emitting layer 110 allows the light emitted to the second reflective layer 140 to be reflected in a direction away from the light incident surface 111 and finally emit through the first reflective layer 130, thereby reducing the loss of the light of the second wavelength and greatly improving the conversion efficiency of the color filter to the light of the first wavelength. In another aspect, the second reflective layer can also be implemented by using the principle of the antireflection film, thereby improving the transmittance of the light of the first wavelength.

It should be noted that the first reflective layer and the second reflective layer in the embodiment may be implemented by a structure including a high refractive index layer and a low refractive index layer.

Figure 5:
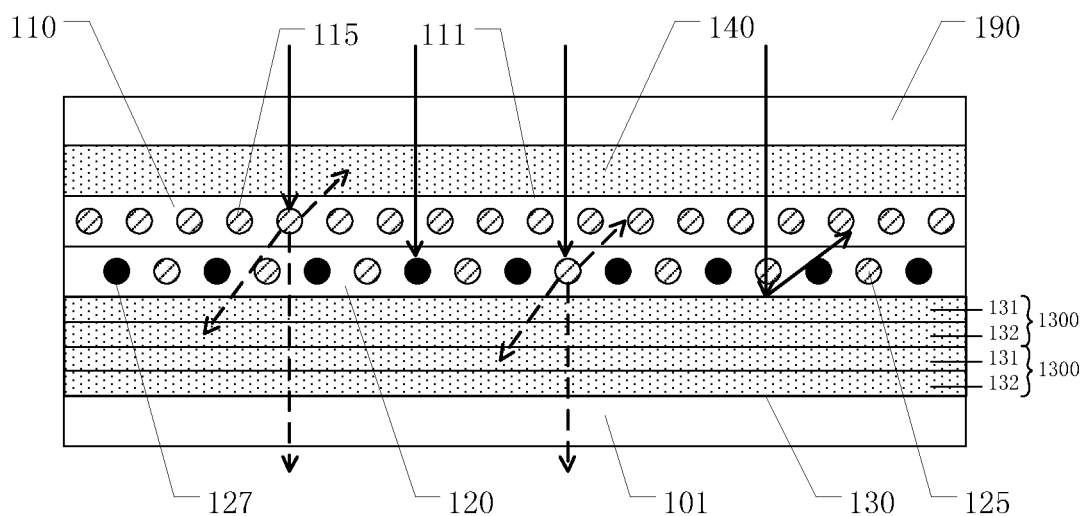
FIG. 5 is a schematic structural diagram of further still another color filter provided by an embodiment of the present disclosure.

For example, FIG. 5 is a schematic structural diagram of further still another color filter. As illustrated in FIG. 5, the first reflective layer 130 includes a plurality of first sub-reflective layers 1300 in a sequential arrangement, each of the first sub-reflective layers 1300 includes a first refractive index layer 131 and a second refractive index layer 132 which are sequentially arranged in a direction from the light incident surface 111 to the first reflective layer 130, and a refractive index of the first refractive index layer 131 is greater than a refractive index of the second refractive index layer 132. Therefore, in the first sub-reflective layer 1300, light of the first wavelength and light of the second wavelength transmit from the first refractive index layer 131 with a relatively large refractive index to the second refractive index layer 132 with a relatively small refractive index, so that the optical thicknesses of the first refractive index layer and the second refractive index layer can be set according to the principle of Braggs reflection, so as to transmit the light of the second wavelength and reflect the light of the first wavelength.

Figure 6:
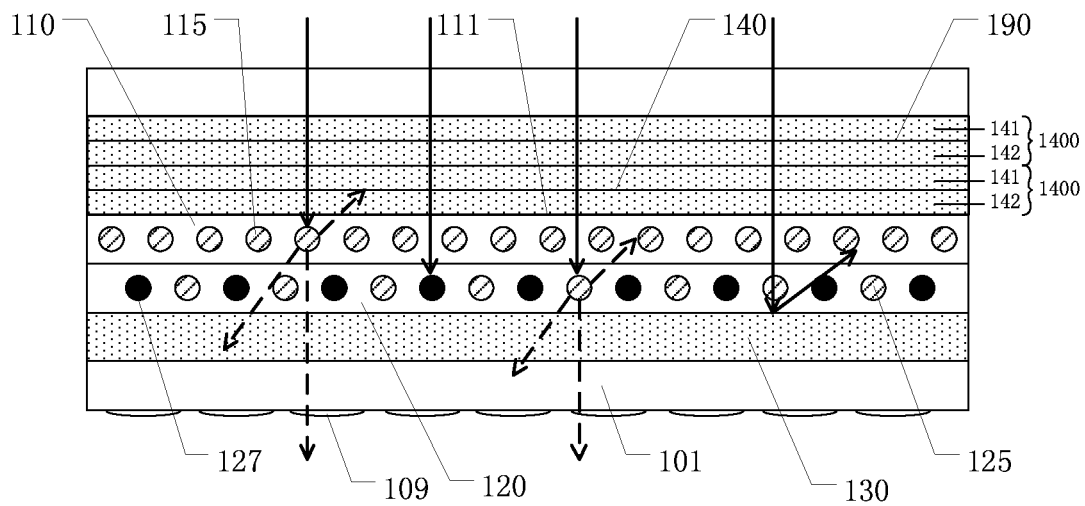
FIG. 6 is a schematic structural diagram of further still another color filter provided by an embodiment of the present disclosure.

For example, FIG. 6 is a schematic structural diagram of further still another color filter. As illustrated in FIG. 6, the second reflective layer 140 includes a plurality of second sub-reflective layers 1400 in a sequential arrangement, each of the second sub-reflective layers 1400 includes a third refractive index layer 141 and a fourth refractive index layer 142 which are sequentially arranged in a direction from the light incident surface 111 to the first reflective layer 130, and a refractive index of the third refractive index layer 141 is less than a refractive index of the fourth refractive index layer 142. In the first sub-reflective layer 1400, light of the first wavelength transmits from the third refractive index layer 141 with a relatively small refractive index to the fourth refractive index layer 142 with a relatively large refractive index, and light of the second wavelength transmits from the fourth refractive index layer 142 with a relatively large refractive index to the third refractive index layer 141 with a relatively small refractive index. Therefore, the optical thicknesses of the third refractive index layer and the fourth refractive index layer can be set according to the principle of the antireflection film to implement the transmission of the light of the first wavelength, thereby increasing the transmittance of the light of the first wavelength, and the optical thicknesses of the third refractive index layer and the fourth refractive index layer can also be set according to the principle of Braggs reflection to implement the reflection of the light of the second wavelength. It should be noted that computer simulation can be used to set reasonable optical thicknesses of the third refractive index layer and the fourth refractive index layer, so as to simultaneously transmit the light of the first wavelength and reflect the light of the second wavelength.

It should be noted that the specific optical thicknesses of the first refractive index layer, the second refractive index layer, the third refractive index layer, and the fourth refractive index layer can be obtained through calculation and simulation.

For example, the thickness of the second reflective index layer is 400 nm to 600 nm. Where the thickness of the second reflective index layer is in a range of 400 nm to 600 nm, the second reflective index layer has both a higher transmittance for light of the first wavelength and a higher reflectivity for light of the second wavelength.

For example, the materials of the first refractive index layer and the second refractive index layer may be titanium oxide and silicon oxide (TiO$_2$/SiO$_2$), or zirconia and magnesium fluoride (ZrO$_2$/MgF$_2$). Certainly, the present disclosure includes, but is not limited to this, and the first refractive index layer and the second refractive index layer may also use other materials.

For example, the materials of the third refractive index layer and the fourth refractive index layer may be silicon oxide and titanium oxide (SiO$_2$/TiO$_2$), or magnesium fluoride and zirconia (MgF$_2$/ZrO$_2$). Certainly, the present disclosure includes, but is not limited to this, and the third refractive index layer and the fourth refractive index layer may also use other materials.

For example, the light of the first wavelength is blue light, and the light of the second wavelength is red light or green light. Certainly, the light of the first wavelength may also be other light, such as violet light, ultraviolet light, etc., and the light of the second wavelength may also be yellow light, etc. The present disclosure includes but is not limited to this.

For example, in some examples, as illustrated in FIG. 6, a micro-lens structure 109 may be provided on a side, away from the first quantum dot light emitting layer 110, of the base substrate 101, so as to control a light emitting range of the light of the second wavelength that is emitted. For example, the micro-lens structure described above may be formed by performing surface processing on the surface of the side, away from the first quantum dot light emitting layer, of the base substrate.

Figure 7:
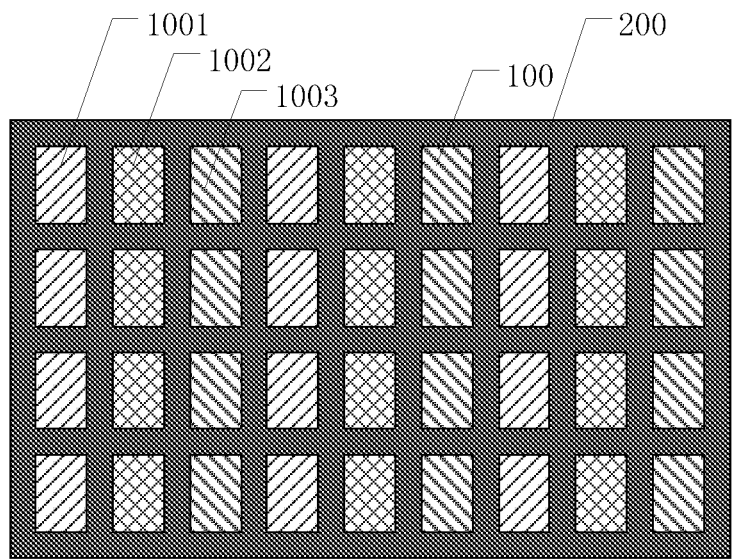
FIG. 7 is a schematic planar diagram of a color filter substrate provided by an embodiment of the present disclosure.

An embodiment of the present disclosure provides a color filter substrate. FIG. 7 is a schematic planar diagram of a color filter substrate. As illustrated in FIG. 7, the color filter substrate includes the color filter described in any one of the above examples. Therefore, the color filter substrate has a high light emitting color purity and can improve the color gamut of the display device using the color filter substrate, thereby allowing the display device using the color filter substrate to have a better image quality.

For example, as illustrated in FIG. 7, the color filter 100 may include a red color filter 1101 and a green color filter 1102. The red color filter 1101 can be used as a red filter, and the green color filter 1102 can be used as a green filter. In the red color filter 1101, the first quantum dots and the second quantum dots can be stimulated to emit red light; and in the green color filter 1102, the first quantum dots and the second quantum dots can be stimulated to emit green light.

For example, in some embodiments, the color filter substrate further includes a blue filter region, and the blue filter region can transmit blue light.

For example, the color filter substrate described above can be used in a display device with a blue backlight. It should be noted that where the backlight is blue light, the region, corresponding to the blue filter, of the color filter substrate, that is, the blue filter region, can be set to be transparent, and no quantum dot light emitting layer is provided as the blue filter.

For example, as illustrated in FIG. 7, the color filter substrate further includes a black matrix 200 around the color filter 100.

An embodiment of the present disclosure further provides a display panel, and the display panel includes the color filter substrate described in any one of the above examples. Therefore, each sub-pixel in the display panel has a higher color purity, thereby improving the color gamut of the display device and allowing the display panel to have a better image quality.

For example, the display panel further includes an array substrate opposite to the color filter substrate, and a liquid crystal layer disposed between the array substrate and the color filter substrate.

An embodiment of the present disclosure further provides a display device, and the display device includes the color filter described in any one of the above examples. Therefore, each sub-pixel in the display device has a higher color purity, thereby improving the color gamut of the display device and allowing the display device to have a better image quality.

For example, the display device may be any electronic product with a display function, such as a mobile phone, a computer, a television, a notebook computer, a navigator, a wearable display device, etc.

It should be noted that the display device may be a liquid crystal display device or an organic light emitting diode display device, and the present disclosure is not limited in this aspect.

Figure 8:
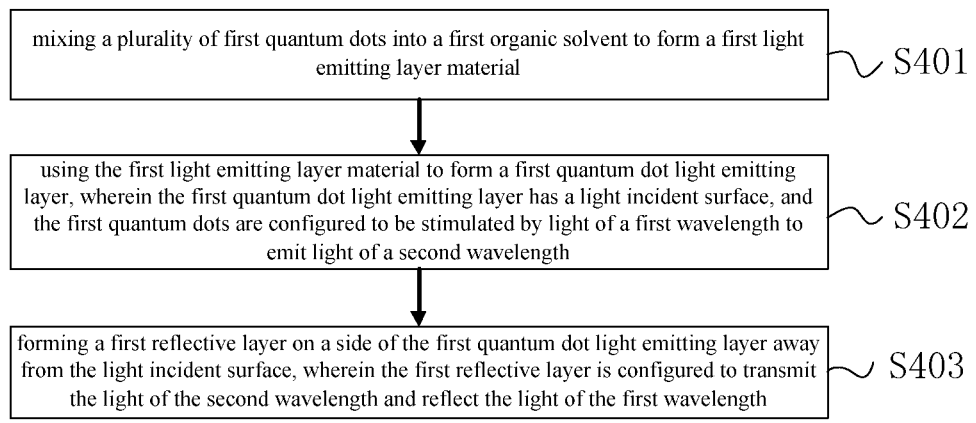
FIG. 8 is a flowchart of a method for manufacturing a color filter provided by an embodiment of the present disclosure.

An embodiment of the present disclosure further provides a method for manufacturing a color filter. FIG. 8 is a flowchart of a method for manufacturing a color filter. As illustrated in FIG. 8, the method for manufacturing the color filter includes steps S401 to S403.

Step S401: mixing a plurality of first quantum dots into a first organic solvent to form a first light emitting layer material.

For example, the organic solvent may be propylene glycol monomethyl ether acetate (PGMEA).

Step S402: using a first light emitting layer material to form a first quantum dot light emitting layer. The first quantum dot light emitting layer has a light incident surface, and the first quantum dots are configured to be stimulated by light of a first wavelength from the light incident surface to emit light of a second wavelength.

For example, a film layer of the first quantum dot material may be formed first, and then a first quantum dot light emitting layer is formed by a photolithography process. In this way, the formation step of the first quantum dot layer is simple and the cost is low. Certainly, the present disclosure includes but is not limited to this, and the first light emitting layer material may also be used to form the first quantum dot light emitting layer by an inkjet printing process. It should be noted that when the inkjet printing process is used, the thickness of the film layer can be adjusted by adjusting the number of prints, the number of print drops, and the drop size.

Step S403: forming a first reflective layer on a side of the first quantum dot light emitting layer away from the light incident surface. The first reflective layer is configured to transmit the light of the second wavelength and reflect the light of the first wavelength.

For example, the reflective layer can be formed by coating methods such as sputtering, vacuum evaporation, and ALD.

Therefore, in the color filter provided by the embodiment, the first reflective layer located on the side of the first quantum dot light emitting layer away from the light incident surface can transmit the light of the second wavelength and reflect the light of the first wavelength. Therefore, the first reflective layer can prevent light of the first wavelength that is not converted by the first quantum dots from being emitted through the first reflective layer, thereby improving the color purity of the emitting light of the color filter.

For example, in some examples, the method for manufacturing the color filter further includes: mixing a plurality of second quantum dots and a plurality of light absorbing materials into a second organic solvent to form a second light emitting layer material, where the second quantum dots are configured to be stimulated by light of the first wavelength from the light incident surface to emit light of the second wavelength, and the light absorbing materials are configured to absorb the light of the first wavelength; and using the second light emitting layer material to form a second quantum dot light emitting layer between the first quantum dot light emitting layer and the first reflective layer. Therefore, in one aspect, the light of the first wavelength that is not converted by the first quantum dots in the first quantum dot light emitting layer can be converted into the light of the second wavelength by the second quantum dots in the second quantum dot light emitting layer additionally provided, thereby further improving the utilization efficiency of the light of the first wavelength from the light incident surface and reducing the light of the first wavelength emitted through the first reflective layer; and in another aspect, the light of the first wavelength that is not converted by the first quantum dots in the first quantum dot light emitting layer can also be absorbed by the light absorbing materials in the second quantum dot light emitting layer additionally provided, thereby further reducing the light of the first wavelength emitted through the first reflective layer. Therefore, the method for manufacturing the color filter further improves the color purity of the emitting light, and improves the utilization efficiency of the light of the first wavelength from the light incident surface.

For example, in some examples, the first organic solvent is immiscible with the second organic solvent, thereby preventing the second organic solvent from dissolving the first quantum dot light emitting layer when the second quantum dot photoresist is formed. It should be noted that, according to the immiscible characteristics of the first organic solvent and the second organic solvent, a plurality of film layers may be spin-coated to implement increasing the thickness of the first quantum dot light emitting layer or the second quantum dot light emitting layer.

For example, the range of the thickness of the first quantum dot light emitting layer may be 1 μm to 3 μm, and the range of the thickness of the second quantum dot light emitting layer may be 1 μm to 3 μm.

For example, in some examples, the ratio of the mass percentage of the second quantum dots to the mass percentage of the light absorbing materials in the second light emitting layer material is in a range of 1 to 2, thereby efficiently absorbing or converting the light of the first wavelength to prevent the leakage of the light of the first wavelength.

For example, in some examples, the ratio of the mass percentage of the second quantum dots to the mass percentage of the light absorbing materials in the second light emitting layer material is 3:2, thereby maximally absorbing or converting the light of the first wavelength to prevent the leakage of the light of the first wavelength.

For example, in some examples, the method for manufacturing the color filter further includes: forming a second reflective layer on a side, where the light incident surface is, of the first quantum dot light emitting layer. The second reflective layer can transmit the light of the first wavelength and reflect the light of the second wavelength. After the first quantum dots or the second quantum dots are stimulated by the light of the first wavelength, the first quantum dots or the second quantum dots emit the light of the second wavelength all around, and the second reflective layer on the side, where the light incident surface is, of the first quantum dot light emitting layer allows the light emitted to the second reflective layer to be reflected in a direction away from the light incident surface and finally emit through the first reflective layer, thereby reducing the loss of the light of the second wavelength and greatly improving the conversion efficiency of the color filter to the light of the first wavelength. In another aspect, the second reflective layer can also be implemented by using the principle of the antireflection film, thereby improving the transmittance of the light of the first wavelength.

For example, in some examples, the first light emitting layer material further includes a resin, a photoinitiator, and an additive. By controlling the total mass percentage of the first quantum dots, the resin, the photoinitiator, and the additive in a range of 15% to 30%, the first light emitting layer material can be suitable for the photolithography process, thereby simplifying the method for manufacturing the color filter. In addition, the first light emitting layer material provided by the example can be compatible with methods such as photolithography, inkjet printing, etc.

It should be noted that where the first quantum dot light emitting layer is formed by the photolithography process, the optical density value of the photolithography process can be in a range of 1.5 to 2.5. For example, the optical density value of the photolithography process can be 2.

For example, in some examples, the second light emitting layer material may also include a resin, a photoinitiator, and an additive. Similarly, the total mass percentage of the second quantum dots, the light absorbing materials, the resin, the photoinitiator, and the additive can be controlled in a range of 15% to 30%, thereby allowing the second light emitting layer material to be suitable for the photolithography process and simplifying the method for manufacturing the color filter.

It should be noted that the additives described above are materials generally used in the photoresist for adjusting the viscosity and surface tension of the photoresist.

For example, in some examples, the total mass percentage of the first quantum dots, the resin, the photoinitiator, and additive can be controlled at 20%. Therefore, the first light emitting layer material is suitable for the photolithography process, and the method for manufacturing the color filter can be simplified.

For example, in some examples, the mass percentage of the first quantum dots can be adjusted to 5% to 10%, and the mass percentage of the resin can be adjusted to 5% to 25%. Therefore, in one aspect, the phenomenon such as the aggregation of the first quantum dots can be prevented, and in another aspect, a higher conversion efficiency of the light of the first wavelength can be obtained. In addition, the first light emitting layer material can further be suitable for the photolithography process, thereby simplifying the method for manufacturing the color filter.

For example, in some examples, the mass percentage of the first quantum dots can be adjusted to 5%, and the mass percentage of the resin can be adjusted to 10%. Therefore, in one aspect, the phenomenon such as the aggregation of the first quantum dots can be prevented, and in another aspect, a higher conversion efficiency of the light of the first wavelength can be obtained. In addition, the first light emitting layer material can further be suitable for the photolithography process, thereby simplifying the method for manufacturing the color filter.

For example, in some examples, the method for manufacturing the color filter further includes exposing and developing the first quantum dot light emitting layer and the second quantum dot light emitting layer, respectively, so as to obtain a patterned first quantum dot light emitting layer and a patterned second quantum dot light emitting layer. It should be noted that the baking temperature in the photolithography process needs to be controlled below 150° C. to prevent high temperature quenching of the quantum dots.

For example, in some examples, the method for manufacturing the color filter further includes: providing a base substrate. The steps of the method for manufacturing the color filter may include: firstly forming the first reflective layer on the base substrate, then forming the second quantum dot light emitting layer on the side, away from the base substrate, of the first reflective layer and exposing and developing the second quantum dot light emitting layer to obtain a patterned second quantum dot light emitting layer, then forming the first quantum dot light emitting layer on the side, away from the base substrate, of the second quantum dot light emitting layer and exposing and developing the first quantum dot light emitting layer to obtain a patterned first quantum dot light emitting layer, and finally manufacturing the second reflective layer and the cover layer (leveling layer). Certainly, the steps of the method for manufacturing the color filter includes, but is not limited to this, and the present disclosure is not limited in this aspect.

For example, in some examples, the method for manufacturing the color filter further includes: performing surface processing on the surface of the side, away from the first quantum dot light emitting layer, of the base substrate to form a micro-lens structure, thereby controlling the light emitting range of the light of the second wavelength.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

What is claimed is:

1. A color filter, comprising:
a first quantum dot light emitting layer, having a light incident surface; and
a first reflective layer, on a side of the first quantum dot light emitting layer away from the light incident surface,
wherein the first quantum dot light emitting layer comprises a plurality of first quantum dots, the first quantum dots are configured to be stimulated by light of a first wavelength from the light incident surface to emit light of a second wavelength, and the first reflective layer is configured to transmit the light of the second wavelength and reflect the light of the first wavelength,
the color filter further comprises a second quantum dot light emitting layer between the first quantum dot light emitting layer and the first reflective layer, the second quantum dot light emitting layer comprises a plurality of second quantum dots and a plurality of light absorbing materials, the second quantum dots are configured to be stimulated by light of the first wavelength from the light incident surface to emit light of the second wavelength, and the light absorbing materials are configured to absorb the light of the first wavelength,
the first quantum dots and the second quantum dots are both stimulated by light of the first wavelength to emit light of the second wavelength.

2. The color filter according to claim 1, further comprising:
a second reflective layer, on a side, where the light incident surface is, of the first quantum dot light emitting layer,
wherein the second reflective layer is configured to transmit the light of the first wavelength and reflect the light of the second wavelength.

3. The color filter according to claim 1, wherein the light of the first wavelength is blue light, and the light of the second wavelength is red light or green light.

4. The color filter according to claim 1, wherein the first reflective layer comprises a plurality of first sub-reflective layers in a sequential arrangement, each of the first sub-reflective layers comprises a first refractive index layer and a second refractive index layer which are sequentially arranged in a direction from the light incident surface to the first reflective layer, and
a refractive index of the first refractive index layer is greater than a refractive index of the second refractive index layer.

5. The color filter according to claim 1, wherein the first quantum dot light emitting layer is in contact with the second quantum dot light emitting layer.

6. The color filter according to claim 2, wherein the second reflective layer comprises a plurality of second sub-reflective layers in a sequential arrangement, each of the second sub-reflective layers comprises a third refractive index layer and a fourth refractive index layer which are sequentially arranged in a direction from the light incident surface to the first reflective layer, and
a refractive index of the third refractive index layer is less than a refractive index of the fourth refractive index layer.

7. The color filter according to claim 1, wherein a thickness of the first reflective layer is in a range of 400 nm to 600 nm.

8. The color filter according to claim 1, wherein a particle size of each of the first quantum dots is in a range of 7 nm to 10 nm.

9. A color filter substrate, comprising the color filter according to claim 1.

10. The color filter substrate according to claim 9, further comprising: a blue filter region,
wherein the blue filter region is configured to transmit blue light.

11. A display device, comprising the color filter according to claim 1.

12. A method for manufacturing a color filter, comprising:
mixing a plurality of first quantum dots into a first organic solvent to form a first light emitting layer material;
using the first light emitting layer material to form a first quantum dot light emitting layer, wherein the first quantum dot light emitting layer has a light incident surface, and the first quantum dots are configured to be stimulated by light of a first wavelength to emit light of a second wavelength;
forming a first reflective layer on a side of the first quantum dot light emitting layer away from the light incident surface, wherein the first reflective layer is configured to transmit the light of the second wavelength and reflect the light of the first wavelength;
mixing a plurality of second quantum dots and a plurality of light absorbing materials into a second organic solvent to form a second light emitting layer material, wherein the second quantum dots are configured to be stimulated by light of the first wavelength to emit light of the second wavelength, and the light absorbing materials are configured to absorb the light of the first wavelength; and using the second light emitting layer material to form a second quantum dot light emitting layer between the first quantum dot light emitting layer and the first reflective layer, wherein the first quantum dots and the second quantum dots are both stimulated by light of the first wavelength to emit light of the second wavelength.

13. The method for manufacturing the color filter according to claim 12, wherein a ratio of a mass percentage of the second quantum dots to a mass percentage of the light absorbing materials in the second light emitting layer material is in a range of 1 to 2.

14. The method for manufacturing the color filter according to claim 12, further comprising:

forming a second reflective layer on a side, where the light incident surface is, of the first quantum dot light emitting layer, wherein the second reflective layer is configured to transmit the light of the first wavelength and reflect the light of the second wavelength.

15. The method for manufacturing the color filter according to claim 12, wherein the first light emitting layer material further comprises a resin, a photoinitiator, and an additive, and a total mass percentage of the first quantum dots, the resin, the photoinitiator, and the additive in the first light emitting layer material is in a range of 15% to 30%.

16. The method for manufacturing the color filter according to claim 15, wherein a mass percentage of the first quantum dots in the first light emitting layer material is in a range of 5% to 10%, and a mass percentage of the resin in the first light emitting layer material is in a range of 5% to 25%.

17. The color filter according to claim 1, wherein the light absorbing materials are a dye that absorbs light of the first wavelength.

* * * * *